(12) United States Patent
Ghosh et al.

(10) Patent No.: US 9,859,018 B2
(45) Date of Patent: Jan. 2, 2018

(54) PHYSICALLY UNCLONABLE FUNCTION BASED ON DOMAIN WALL MEMORY AND METHOD OF USE

(71) Applicants: Swaroop Ghosh, Tampa, FL (US); Anirudh Srikant Iyengar, Centre Hall, PA (US); Kenneth Ramclam, Tampa, FL (US)

(72) Inventors: Swaroop Ghosh, Tampa, FL (US); Anirudh Srikant Iyengar, Centre Hall, PA (US); Kenneth Ramclam, Tampa, FL (US)

(73) Assignee: University of South Florida, Tampa, FL (US)

( * ) Notice: Subject to any disclaimer, the term of this patent is extended or adjusted under 35 U.S.C. 154(b) by 0 days.

(21) Appl. No.: 15/330,829

(22) Filed: Nov. 7, 2016

(65) Prior Publication Data

US 2017/0062072 A1    Mar. 2, 2017

Related U.S. Application Data

(63) Continuation of application No. PCT/US2015/029255, filed on May 5, 2015.
(Continued)

(56) References Cited

U.S. PATENT DOCUMENTS 8,525,169 B1   9/2013 Edelstein et al.
8,619,979 B2   12/2013 Ficke et al.
(Continued)

FOREIGN PATENT DOCUMENTS

WO   2009050673 A1   4/2009
WO   2014060126 A1   4/2014

OTHER PUBLICATIONS

Iyengar, Ramclam, and Ghosh, "DWM-PUF: A Low-Overhead, Memory-based Security Primitive", May 6, 2014, 2014 IEEE International Symposium on Hardwar-Oriented Security and Trust (HOST), pp. 154-159.*
(Continued)

Primary Examiner — Huan Hoang
Assistant Examiner — Jay Radke
(74) Attorney, Agent, or Firm — Molly L. Sauter; Smith & Hopen, P.A.

(57) ABSTRACT

A system and method for providing a physically unclonable function (PFU) is described. In operation, the method includes applying a domain wall shift pulse challenge to a plurality of nanowires of a domain wall memory (DWM) array wherein the nanowires of the domain wall memory

Related U.S. Application Data

(60) Provisional application No. 61/988,732, filed on May 5, 2014.

(52) U.S. Cl.
CPC ...... *G11C 11/1657* (2013.01); *G11C 11/1659* (2013.01); *G11C 11/1673* (2013.01); *G11C 11/1675* (2013.01); *G11C 11/1693* (2013.01); *G11C 19/0841* (2013.01); *G11C 19/0875* (2013.01)

(56) References Cited

U.S. PATENT DOCUMENTS

| 8,659,124 | B2 | 2/2014 | Roest et al. |
|---|---|---|---|
| 8,700,916 | B2 | 4/2014 | Bell et al. |
| 2004/0252538 | A1 | 12/2004 | Parkin |
| 2008/0243972 | A1 | 10/2008 | Gaidis et al. |
| 2010/0090687 | A1 | 4/2010 | Wang et al. |
| 2011/0157955 | A1 | 6/2011 | Hung et al. |

OTHER PUBLICATIONS

Energy Efiicent In-Memory AES Encryption Based on Nonvolatile Domain-wall Nanowire, Mar. 24, 2014, Design, Automation, and Test in Europe Conference and Exhibition.*

Bolotnyy and Robins. Physically Unclonable Function-Based Security and Privacy in RFID Systems. Proceedings of the Fifth Annual IEEE International Conference on Pervasive Computing and Communications (PerCom '07). 2007: 1-8.

International Search Report for PCT/US2015/029255 (filing date May 5, 2015) dated Jul. 28, 2015; Applicant: University of South Florida et al.

International Preliminary Report on Patentability for PCT/US2015/029255 (filing date May 5, 2015) with a priority date o May 5, 2014; Applicant: University of South Florida et al.

\* cited by examiner

PHYSICALLY UNCLONABLE FUNCTION BASED ON DOMAIN WALL MEMORY AND METHOD OF USE

CROSS-REFERENCE TO RELATED APPLICATIONS

This nonprovisional application is a continuation of and claims priority to International Patent Application No. PCT/US2015/029255, entitled "PHYSICALLY UNCLONABLE FUNCTION BASED ON DOMAIN WALL MEMORY AND METHOD OF USE", filed May 5, 2015 by the same inventors, which claims priority to provisional U.S. Patent Application Ser. No. 61/988,732 filed on May 5, 2014, titled, "Methods and Apparatus to Build Physically Unclonable Functions using Spintronic Domain Wall Memory", which is hereby incorporated by reference in its entirety.

BACKGROUND

The manufacturing of the present day integrated circuits (IC) are primarily outsourced to external companies. Under this business model, the design of the IC is exposed to tampering and cloning by the third party manufacturing company, thereby breaching the Intellectual Property (IP) of the design. Additionally, IC cloning also siphons off the economic benefits of the product. Due to these external manufacturing companies being employed by adversaries, isolating the forged ICs from the authentic ICs is becoming an increasingly difficult task.

Traditionally, unique keys are generated by the ICs for important applications, such as IP security, counter-plagiarism, etc. These unique keys are stored on the on-chip, non-volatile, memory that is considered to be impervious to illegal access and duplication. However, it is known that adversaries can decode these unique keys through Reverse Engineering (RE). A duplicated IC chip having a unique key obtained through RE cannot be distinguished from the genuine IC chip.

In an effort to address the issue of reverse engineering of unique IC security keys, an auxiliary circuit, commonly known as a Physically Unclonable Function (PUF), is incorporated into the authentic chips during the manufacturing process. PUFs are designed to exploit the unique physical properties of the individual chip (e.g. process) to generate a unique identification key for the chip. PUFs are unclonable, because duplication of the IC will not provide the same identification tag as the original IC, even if the ICs are functionally identical. PUFs operate on the foundation of a challenge-response protocol, which functions of the basis of uniqueness of the complex and variable nature of the physical process used to manufacture the IC.

PUFs fall under two basic categories: electronic and non-electronic. Electronic PUFs are based upon electronic properties that determine the challenge-response protocols, such as gate delay, threshold voltage switching times, etc. Electronic PUFs known in the art include Arbiter PUFs, Ring-Oscillator PUFs, SRAM PUFs and nano-electronic PUFs. The non-electronic PUFs use non-electrical challenge-response mechanisms for their operation. Non-electronic PUFs known in the art include optical PUFs, magnetic PUFs and acoustical PUFs. While the PUFs known in the art have been effective as security primitives to address hardware security issues, improvements are needed in the field of the invention to improve the robustness of the PUF devices, to decrease the area requirements and to reduce the power requirements of the PUF devices.

Accordingly, what is needed in the art is a system and method for user authentication which overcomes the deficiencies of the authentication systems and methods currently known in the art.

SUMMARY OF THE INVENTION

The present invention provides a system and method for providing a physically unclonable function (PUF) in an integrated circuit based upon the principles of spintronic domain wall memory (DWM) arrays.

In accordance with one embodiment of the present invention, a method of providing a physically unclonable function (PUF) in a domain wall memory (DWM) array of an integrated circuit is provided. The method includes, applying a domain wall shift pulse challenge to a plurality of nanowires comprising a domain wall memory (DWM) array of an integrated circuit, wherein at least one of the plurality of nanowires comprises at least one process induced variation and measuring the response of the plurality of nanowires of the domain wall memory to the applied domain wall shift pulse challenge to provide a physically unclonable function (PUF) for the integrated circuit. In this embodiment, the process induced variation results in pinning potentials within the various nanowires, which affects the speed with which the domain wall travels along the length of the nanowire. As such, by exploiting the speed with which the domain wall travels along the nanowires, a unique signature, which is a result of the process variations in the nanowires of the array, can be generated.

In one embodiment, a relay-PUF is provided in which a domain wall race is initiated among two or more parallel nanowire paths by the domain wall shift pulse challenge and the winners of the domain wall race determine the response to the challenge and are used to provide the PUF for the integrated circuit In an additional embodiment, a memory-PUF is provided in which a domain wall race is initiated within a plurality of the nanowires in the array, substantially simultaneously, by the domain wall shift pulse challenge and the winners of the domain wall race determine the response to the challenge and are identified by the assertion of a read signal at one or more read heads and a particular array address, thereby providing the PUF for the integrated circuit.

The characteristics of the domain wall shift pulse challenge may be adjusted to result in the generation of different PUFs from the same nanowire array. The adjustable characteristics may include the pulse magnitude, the pulse width and the pulse frequency.

In an additional embodiment, an integrated circuit comprising a physically unclonable function (PUF) may include, a domain wall memory (DWM) array comprising a plurality of nanowires, wherein at least one of the plurality of nanowires comprises at least one process induced variation, a domain wall shift pulse challenge circuit for applying a domain wall shift pulse challenge to two or more of the plurality of nanowires of the domain wall memory (DWM) array and a measuring circuit for measuring the response of the two or more nanowires of the domain wall memory to the applied domain wall shift pulse challenge to provide a physically unclonable function (PUF) for the integrated circuit.

In another embodiment, a device having a physically unclonable function (PUF) may include, an integrated circuit, a domain wall memory (DWM) array comprising a plurality of nanowires embedded in the integrated circuit, wherein at least one nanowire comprises at least one process induced variation, a domain wall shift pulse challenge circuit for applying a domain wall shift pulse challenge to two or more of the plurality of nanowires of the domain wall memory (DWM) array and a measuring circuit for measuring the response of the two or more nanowires of the domain wall memory to the applied domain wall shift pulse challenge to provide a physically unclonable function (PUF) for the integrated circuit.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

Many aspects of the present disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views.

DETAILED DESCRIPTION OF THE INVENTION

Figure 1A:
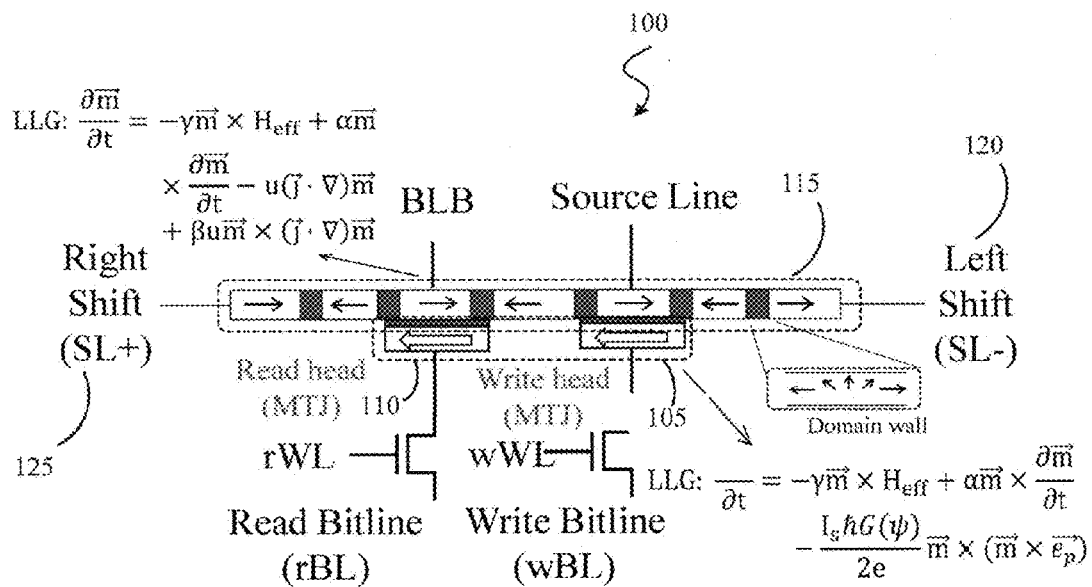
FIG. 1A is a schematic diagram of a domain wall memory (DMW) and associated governing equations, in accordance with an embodiment of the present invention.
Figure 1B:
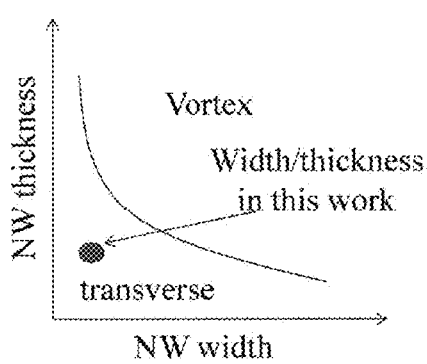
FIG. 1B is a graphical illustration of types of domain walls and their dependency on nanowire dimensions, in accordance with an embodiment of the present invention.
Figure 1C:
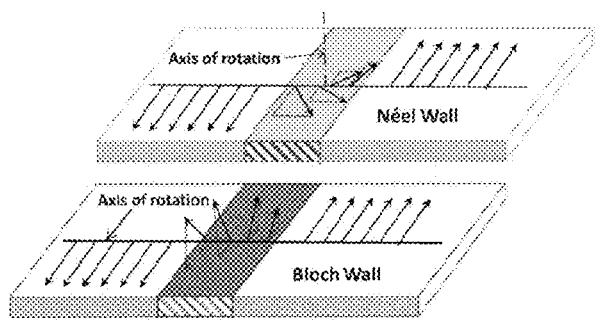
FIG. 1C is a diagram illustrating two types of transverse domain walls, Bloch walls and Neel walls.

The present disclosure describes systems and methods for the application of spintronics for hardware security and authentication. In various embodiments, the present invention provides two novel spintronic physically unclonable functions (PUF): relay-PUF and memory-PUF. Both relay-PUF and memory-PUF exploit the process variation induced domain wall pinning in nanowires and the resulting slow-down to generate a response to a presented challenge. By exploiting the randomness of the domain wall velocity due to process variations induced pinning, an authentication key unique to the device at hand is generated. The basic premise is to trigger a domain wall race between nanowires in the memory array. Due to process variations, the domain wall velocity is detected by the read head of the memory array. In the case of a memory-PUF of the present invention, if the read head timing edge is fixed, then the domain walls in the nanowire that fail to reach the read head for a pre-determined fixed time quantum are assigned a value of '0'. The nanowires who's domain walls successfully reach the read head within the time quantum are assigned a value of '1'. Additionally, this concepts is used in a relay-PUF in accordance with an additional embodiment of the present invention, which concatenates nanowires in parallel configuration to create a relay-race, wherein the winning path will determine the response of the PUF. A race is in the domain wall memory array where the winning nanowires will read a '1' and the remaining nanowires will read a '0'. This random pattern in the domain wall memory array is then used as the signature (memory-PUF). Process variation being random and unique to every integrated circuit, the key generated will vary from die-to-die.

In additional embodiments, the present invention provides added controls to expand the set of challenge-response pairs, including variation in the shift pulse and the number of access ports. Due to the non-volatile nature of the domain wall memory array structure, the proposed memory-PUF provides a low-power solution, when compared to conventional SRAM-PUFs.

Recent experimental results on spin valves such as, magnetic-tunnel junctions (MIT) and domain wall memory (DWM) have created enormous interest in spin based computations. The most promising effect is current induced modulation of magnetization dynamics discovered in MTJ and DWM as they facilitate energy-efficient logic and memory designs. Interaction between injected current and local magnetization creates several Spin-Transfer Torque (STT) mechanisms that are excellent sources of entropy in the magnet.

In the present invention, the nonlinear dynamics of domain walls (DWs) in the physical magnetic system are leveraged for hardware security and authentication. Accordingly, this is the first effort known in the art towards employing spintronics for designing physically unclonable functions (PUFs).

Magnetic memory is promising due to its high-density, low-power requirements and non-volatility. Domain wall memory (DWM) is a type of magnetic memory that provides high-density as a result of its ability to store multiple bits per bitcell. Additionally, DWM provides low standby power, as a result of the non-volatile nature of the device, fast access and superior endurance and retention.

With reference to FIG. 1A, a domain wall memory (DWM) 100 consists of three components: write head 105, read head 110 and magnetic nanowire 115. The read head and 105 write head 110 are similar to conventional magnetic-tunnel junctions (MJT), and the magnetic nanowire 115 holds the bits based upon the magnetic polarity in the nanowire. The most interesting effect in the nanowire is the formation of domain walls (DW) between domains of opposite polarities. The nanowire dynamics are governed by the dynamics of the domain walls. The domain walls can be shifted forward and backward by injecting charge current from left-shift (LS) 120 and right-shift (RS) 125 contacts. In essence, the nanowire 115 is analogous to a shift register. The new domains are injected in the nanowire 115 by pushing current through shift contacts 120, 125 to move the bits in lockstep fashion in order to bring the desired bit under the write head 105. After the desired bit is under the write head 105, spin polarized current is injected through the write magnetic-tunnel junction of the write head 105, using write wordline (wWL), write bitline (wBL) and select line (SL), in a positive or negative direction to write a '1' (up-spin) or a '0' (down-spin) in the nanowire 115. A read is performed by bringing the desired bit under the read head 110 by shifting and sensing the resistance of the magnetic-tunnel junction formed by the new bit (after the domain wall crosses the read head 110) using the read bitline (rBL) and the read wordline (rWL). This described mechanism makes shifting of domain walls critical to the functionality of the domain wall memory 100. The robustness, speed and power consumption of the domain wall memory 100 has a significant dependency on the domain wall dynamics. Various factors affect the domain wall motion, such as shift current, magnitude, phase, physical properties of the nanowire, etc.

When two domains meet in the nanowire, a domain wall is formed where the magnetization changes orientation (shown schematically in FIG. 1 inset). The most prominent types of domain walls are: (a) transverse wall (TW) and (b) vortex wall (VW). As illustrated in FIG. 1B, the type of domain wall depends upon the width and thickness of the magnetic nanowire. For the thickness and width under consideration in an exemplary embodiment of the invention, in can be safely assumed that the domain walls are of the transverse wall (TW) type. Additionally, the transverse type domain wall can be considered either a Neel wall or a Bloch wall, as illustrated with reference to FIG. 1C. For these exemplary embodiments, the Bloch wall transverse domain wall is assumed because it is more prominent in thin nanowires, such as those employed in the embodiments of the present invention.

Figure 1D:
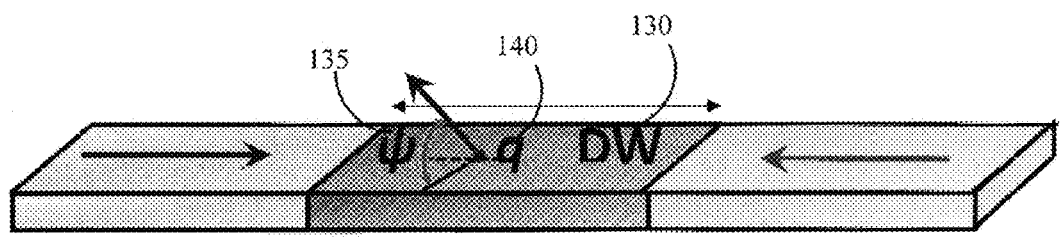
FIG. 1D is a diagram illustrating the domain wall position and the domain wall tilt angle in a nanowire segment.

With reference to FIG. 1D, the domain wall 130 position 140 and tilt angle 135 are determined by solving the Landau-Liftshitz Gilbert (LLG) equation, which is a torque balancing equation:

$$\frac{\partial \vec{m}}{\partial t} = -\gamma \vec{m} \times \vec{H_{\mathit{eff}}} + \alpha \vec{m} \times \frac{\partial \vec{m}}{\partial t} - u(\vec{j} \cdot \nabla)\vec{m} + \beta u \vec{m} \times (\vec{j} \cdot \nabla)\vec{m}$$

Where $\vec{m}$ and $\vec{j}$ are unit vectors representing local magnetic moment of the domain wall and current flow, respectively, $$\vec{H_{\mathit{eff}}} = -\frac{1}{\mu_0 M_s} \frac{\delta w}{\delta \vec{m}}$$

is the effective field, $\alpha$ is a damping constant, $\beta$ is a non-adiabatic spin torque transfer term and u is a scalar quantity having the units of velocity. The term u depends upon the current density J, the spin polarization P, saturation magnetization $M_s$ and Bohr Magneton $\mu_B$ as follows:

$$u\frac{\mu_B J P}{e M s}, \mu_B = \frac{he}{2m_e}$$

In the above expression, h is a reduced plank's constant, e is electron charge and $m_e$ is electron mass. The final expressions of motion are given by:

$$(1 + \alpha^2)\dot{q} = \frac{\mu_0}{2}\gamma\Delta(H_k\sin 2\psi - \pi H_T) + \alpha\Delta\gamma\left(\mu_0 H_A - \frac{Vq}{M_s d}\right) + (1 + \alpha\beta)u$$

$$(1 + \alpha^2)\dot{\psi} = \frac{\mu_0}{2}\alpha\gamma(H_k\sin 2\psi - \pi H_T) + \gamma\left(\mu_0 H_A - \frac{Vq}{M_s d}\right) + \left(\frac{\beta - \alpha}{\Delta}\right)u$$

Where, $\dot{q}$ and $\dot{\psi}$ are the time derivatives of the domain wall position and tilt angel, respectively. The position (q) 140 and tilt angle ($\psi$) 135 of the domain wall were modeled using Verilog-A and the values of the constants shown in Table 1 below.

TABLE 1

MAGNETIC CONSTANTS USED FOR DOMAIN WALL DYNAMICS

| Parameter | Value |
| --- | --- |
| α | Varied (0.01-0.02) |
| β | Varied (0.0-0.1) |
| Bohr Magneton ($\mu_B$) | $9.27e^{-24}$ J/T |
| $M_s$ | $8e^5$ A/m |
| Exchange Constant (A) | $1.3e^{-11}$ J/m |
| Length (l)/Width (w)/Thickness (t) of nanowire | $1e^{-6}$ m/$100e^{-9}$ m/$10e^{-9}$ m |
| γ | $1.76e^{11}$/G s |
| Demagnetization Field ($H_k$) | 1600-1800 Oe |

The above expressions don't consider the effect of process variation induced roughness of the nanowire on the domain wall dynamics. The process variations in the nanowire could create unwanted physical notches that could pin the domain wall or degrade its velocity. The magnitude of pinning energy is dependent upon the dimensions of the physical notch. The pinning energy can be modeled as follows:

$$\sigma_{pin} = \frac{V(q - q_{pin})^2}{M_s(2d)} \begin{cases} V = V_{pin} & q_{pin} - d \leq q \leq q_{pin} + d \\ V = 0 & \text{otherwise} \end{cases}$$

Where $q_{pin}$ is the pinning site, $V_{pin}$ is the pinning potential at that particular site location and d is the pinning width. Multiple pinning sites are modeled by changing $q_{pin}$, accordingly. The LLG can be solved with the pinning sites in order to observe the impact of the domain wall dynamics.

In practice, several techniques have been suggested to mitigate the effect of process variations in the nanowire. However, in the present invention, it is demonstrated that the inherent variations in the nanowire can be exploited to generate challenge-response pairs that can be used for authentication purposes. To understand the impact of these variations, two experiments were conducted. First, the pinning locations ($q_1/q_2$ and $q_1/q_2/q_3$) are fixed and the pinning potential is set to be equal to 2000 J/m³. This condition is set to simulate the intentional pinning and depinning to study its impact on shift current. Next, the pinning potential is distributed to two and three equal and smaller pinning sites to simulate the impact of unintentional notches due to process variations.

Figure 2A:
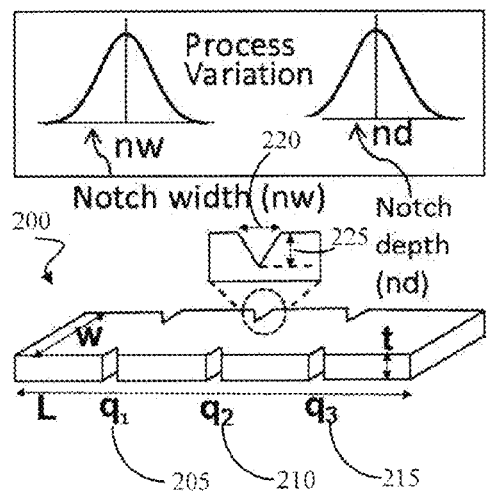
FIG. 2A is an illustration of nanowire with three pinning sites, in accordance with an embodiment of the present invention.
Figure 2B:
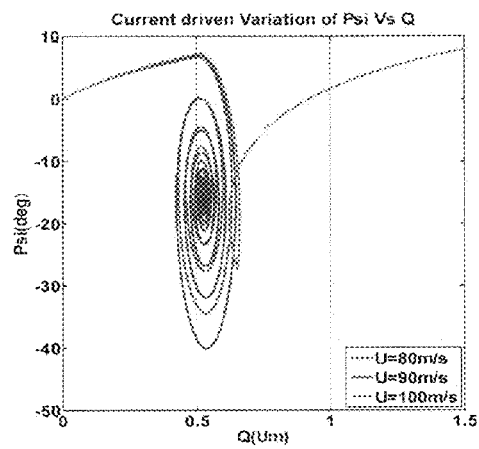
FIG. 2B is a plot of the position of the pinning site vs. domain wall shift pulse voltage at a first pinning position in the nanowire, in accordance with an embodiment of the present invention.
Figure 2C:
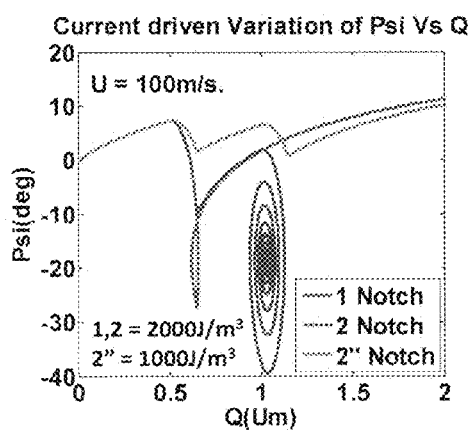
FIG. 2C is a plot of the position of the pinning site vs. domain wall shift pulse voltage at a first pinning position and a second pinning position, in accordance with an embodiment of the present invention.
Figure 2D:
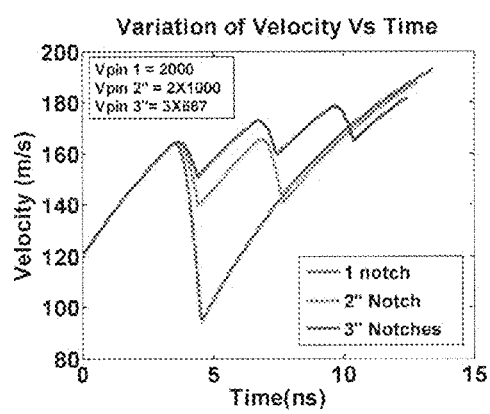
FIG. 2D is a plot illustrating transient velocity for one deep pinning and two cases of shallow pinning, in accordance with an embodiment of the present invention.

With reference to FIG. 2A, for this simulation, it is assumed that the nanowire 200 is 2 μm in length and the pinning sites are fixed at $q_1$=0.5 μm 205, $q_2$=1 μm 210 and $q_3$=1.5 μm 215. The notch width (d) 220 is assumed to be 150 nm. FIG. 2B illustrates the $\psi$ vs. q plot of the domain wall for the pinning site at $q_1$ 205 for three different magnitudes u of injected shift currents. As is illustrated, the domain wall is pinned in the first two cases (u=80 m/s and u=90 m/s), but dislodges successfully with u=100 m/s. This plot indicates the need for a higher current (i.e. higher power) to dislodge the domain wall. FIGS. 2C and 2D illustrate the experimental results with pinning at two sites, $q_1$ 210 and $q_2$, 215 with $V_{pin1}$=2000 J/m³. As is shown, with u=100 m/s the domain wall is depinned at location $q_1$ 205 but is pinned at location $q_2$ 210. These results indicate that velocity degradation due to the first notch at $q_1$ 205, even though the location does not result in pinning, can cause pinning in the next notch at $q_2$ 210. As illustrated, the same current successfully dislodges two notches of half the pinning potential (i.e., $V_{pin1}$=1000 J/m³), which is due to the location of the pinning sites. If multiple notches are located close to each other, they can pin the domain wall due to the domain wall velocity degradation resulting from the notches. If the next notch arrives before the full recovery of the domain wall velocity of the previous notch, then the next notch is more likely to be pinned. As such, it is shown that the average velocity of the domain wall can be affected significantly due to the presence of unintentional process variation induced notches in the nanowire.

Figure 3A:
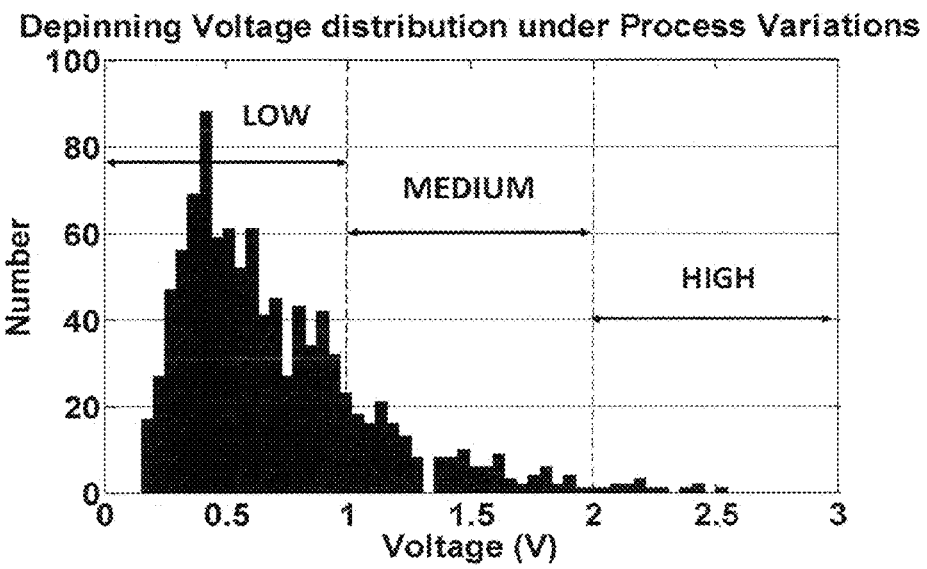
FIG. 3A is a plot of the distribution of depinning voltage under process variation, in accordance with an embodiment of the present invention.

In order to study the impact of the process variations in the nanowire 200, the relationship between the depinning magnetic field ($H_{th}$) and its dependency on notch depth (nt) 225 for the nanowire 200 is first modeled and then the presence of a single notch at $q_{pin}$=0 under process variation induced notch width (d) 220 and depth (nt) 225 functions are studied. The variation in d 220 and nt 225 is assumed to be Gaussian with mean (μ) and sigma (σ) of ($\mu_d$, $\sigma_d$)=(0, 6.66 nm) and ($\mu_{nt}$, $\sigma_{nt}$)=(0, 50 nm). In this study, the supply voltage of the shift circuit is swept from 0 to 3V and the minimum voltage to dislodge the domain wall is plotted as shown in FIG. 3A for 1000 runs of Monte Carlo simulation. As is illustrated in FIG. 3A, the unwanted pinning of the domain wall is dominated by the long tail of the distribution, which indicates that random process variations can have a considerable impact on the velocity of the domain wall.

In accordance with the present invention, pinning of the domain wall, which results in randomness in the domain wall velocity, is exploited to generate an authentication key. The basic premise is to trigger a domain wall race between nanowires in the domain wall memory array. Due to variation in speed of the domain walls, as a result of the process induced variations in the different nanowires, the domain walls in each of the nanowires will reach the read head at different times. If the read timing edge is fixed, some nanowires will read '0' and the others will read '1' at the end of the shift and read operation. In the present invention, this random pattern in the domain wall memory is used as the authentication signature, or memory physically unclonable function (PUF).

Figure 3B:
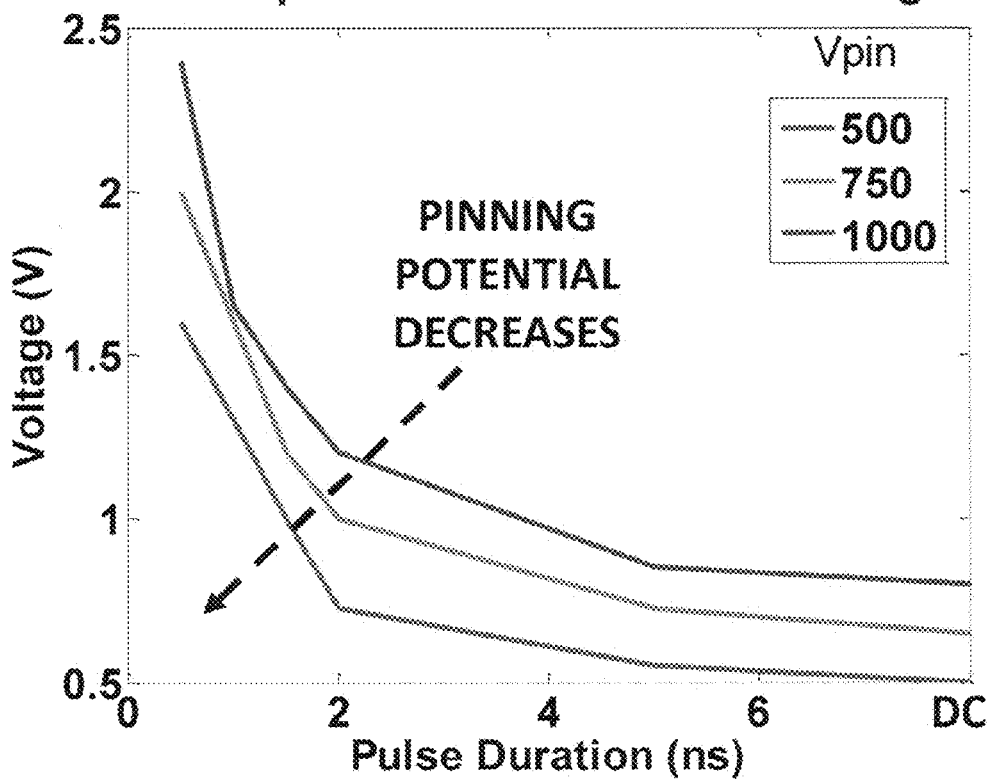
FIG. 3B is a plot of the dependence of the shift pulse magnitude on pulse duration for different levels of pinning potential, in accordance with an embodiment of the present invention.

FIG. 3B illustrates the dependency of the shift voltage pulse width and the pulse magnitude for dislodging the domain wall at three different pinning potentials. As illustrated, a wider pulse can depin the domain wall with a smaller magnitude of pulse. However, as the pulse width becomes narrower, the magnitude of the pulse required to depin the domain wall increases. The pulse magnitude for DC input conditions is also illustrated on the x-axis of the graph of FIG. 3B. FIG. 3C illustrates the variation of the domain wall velocity for different pulse frequencies, with a constant ON time of 5 ns and varying OFF times between 2 ns and 5 ns. It is noted that there are three conditions, voltage magnitude and pulse width and pulse frequency, which directly affect the domain wall velocity. As such, there exist three means by which to manipulate the domain wall motion in the nanowire, thus enabling the use of both voltage magnitude, pulse width and pulse frequency to generate challenges for the domain wall memory PUF.

Physically unclonable functions (PUF) are commonly grouped under two general categories: "strong" and "weak" PUF. A "strong" PUF is one in which the challenge-response pairs grow exponentially with physical size and challenge parameters. In contrast, a "weak" PUF is one in which the challenge-response pairs grow linearly with the size of the implementation. In the present invention, the relay-PUF falls under the category of "strong" PUFs since, the number of challenge-response pairs can be exponentially increased by varying the pulse width, pulse magnitude and pulse frequency and the memory-PUF falls under the category of a "weak" PUF.

Figure 4:
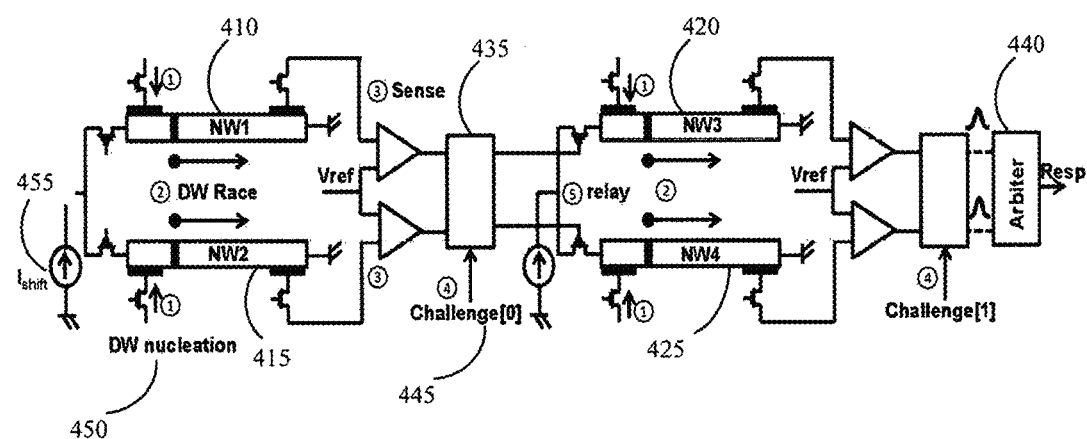
FIG. 4 is a schematic diagram illustrating the relay-PUF comprising multiple stages of parallel nanowires, write and read heads, sensing circuitry, switching block and an arbiter, in accordance with an embodiment of the present invention.

With reference to FIG. 4, in one embodiment, the concept of domain wall velocity due to inherent process variation is exploited by combining nanowires 410, 415, 420, 425 in multiple stages, in sets of two, to provide a relay-PUF 400. In the relay-PUF 400, switching circuitry 435 is used between each stage to switch between paths, in accordance with a challenge pattern 445. By increasing the number of stages, the randomness of the relay-race is improved. An arbiter block 440 is placed at the end to compare the arrival times of the respective domain walls.

Figure 5A:
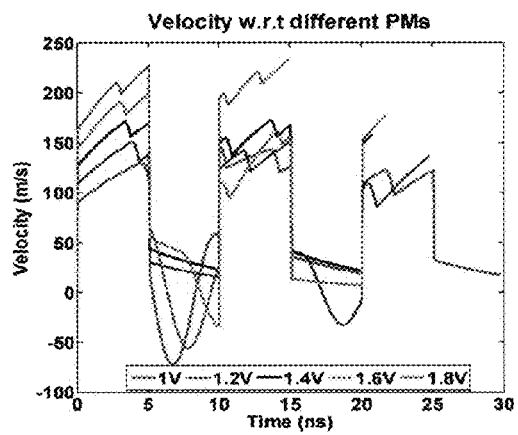
FIG. 5A is a graphical illustration of the relationship of the domain wall velocity on the three pulse voltage conditions for various pulse magnitudes, in accordance with an embodiment of the present invention.
Figure 5B:
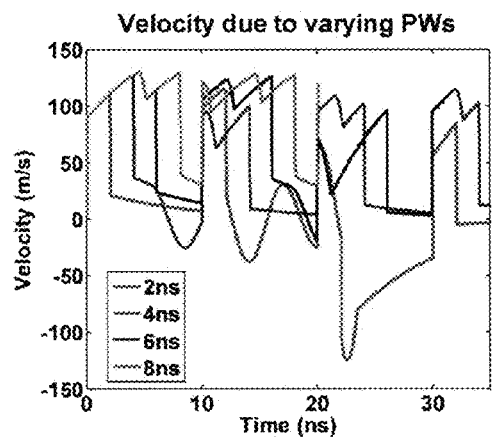
FIG. 5B is a graphical illustration of the relationship of the domain wall velocity on the three pulse voltage conditions for various pulse width, in accordance with an embodiment of the present invention.
Figure 5C:
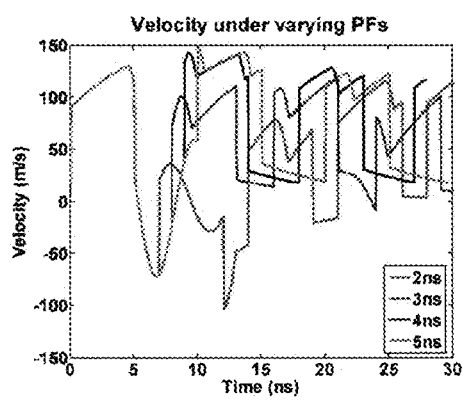
FIG. 5C is a graphical illustration of the velocity of the domain walls in the nanowire under varying pulse frequencies, in accordance with an embodiment of the present invention.

In contrast with convention delay-PUF, where only the select signal to the switching circuitry (muxing) are used as challenges, the relay-PUF provides three additional sets of challenges, namely, shift pulse magnitude (PM), shift pulse width (PW) and shift pulse frequency (PF). As shown in FIG. 5A-5C, The variation of velocity for the three challenges are shown for a nanowires containing 3 pinning sites that are equidistantly spaced along its length. The pinning potential is ~500 J/m$^3$. FIG. 5A shows the variation of velocity for five pulse magnitudes (1-1.8V) for a pulse with 5 ns ON/OFF. In the second case, FIG. 5B, the pulse width is varied (2 ns-8 ns) for a constant pulse period of 10 ns. And finally, FIG. 5C shows the variation of the domain wall velocity for different pulse frequencies, with a constant ON time of 5 ns and varying OFF times (2 ns-5 ns). A direct impact on the velocity of the domain wall is observed for the three conditions. Furthermore, these new challenge can be employed to increase the size of the challenge-response pairs with small area overhead.

In order to incorporate an adequate amount of randomness into the relay-PUF, a long chain of such nanowires are used. The first step of operation is to nucleate 450 the domain walls in all of the nanowires by applying a pulsed (+/−) current, during which the write word line is activated. Following which, the shift signal 455 of stage-1, comprising NW1 410 and NW2 415, is activated, which triggers the domain wall race in stage-1. The read head is activated by pulsing the read word line. As soon as the resistance sensed by the read head changes (by sensing the magnetization change), the shifting of stage-1 stops. Once the read head detects the arrival of the domain wall (i.e. the domain wall reaches the end of the nanowire), the shift signal of stage-2, comprising NW3 420 and NW4 425, is activated, thus relaying the domain wall information to the next stage. The switching circuitry 445 determines whether the upper or lower domain wall will be fired in the following state.

Figure 6:
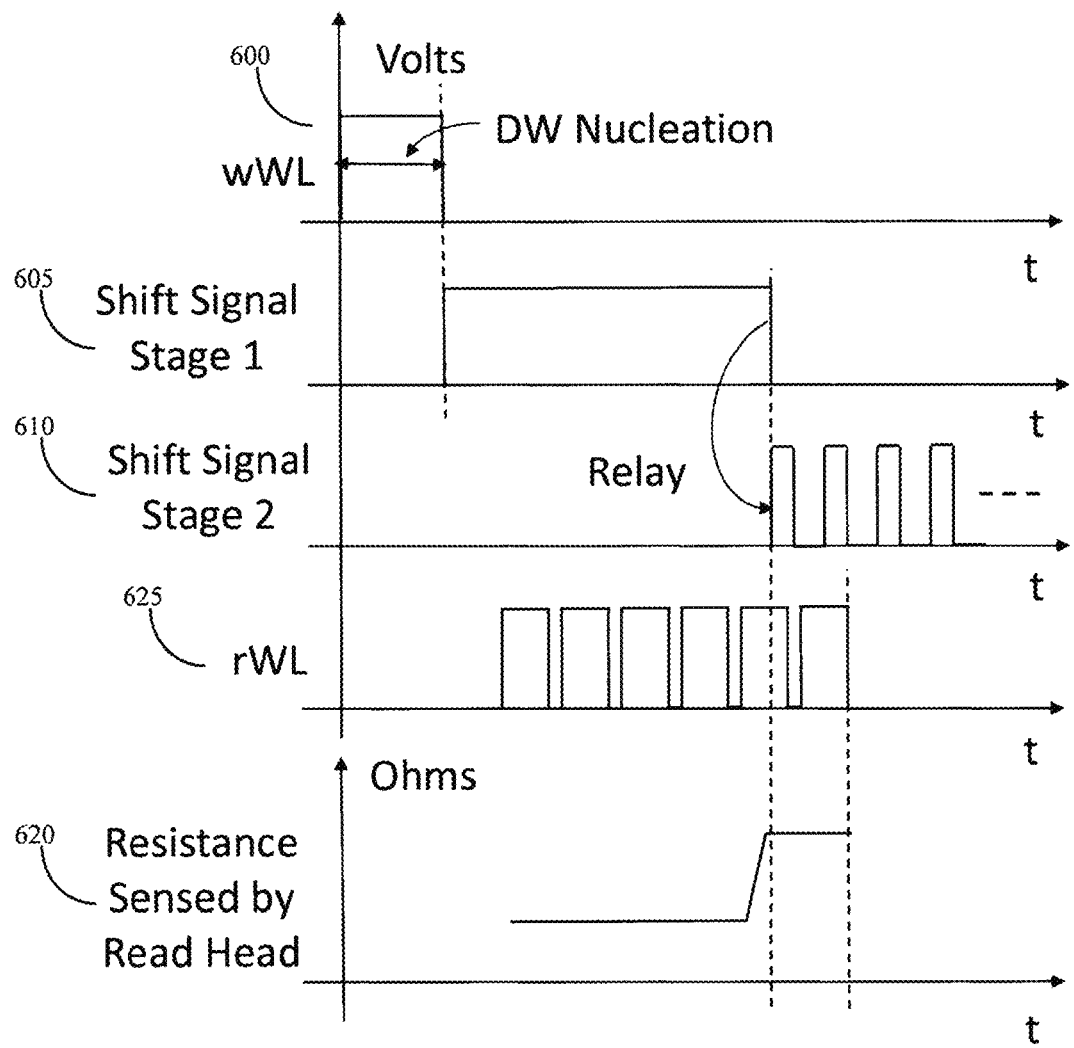
FIG. 6 is a timing diagram representing the wWL, the shift signals for each stage, the rWL and the variation of resistance sensed w.r.t. time, in accordance with an embodiment of the relay-PUF of the present invention.

The response of the relay-PUF is determined by an arbiter 440 in accordance with the arrival of the domain walls in the parallel nanowires. If the top (bottom) domain wall reaches first, the response of the PUF is '0' ('1'). The switching of paths in association with shift pulse magnitude, pulse width and pulse frequency provides several layers of randomness in the race conditions. The outcome of the race is highly randomized as the process variation is different for different nanowires and the size and location of the bumps and dents are random in nature. Depending upon the path the domain wall takes, the outcome of the race can be varied. For example, a fast domain wall in one nanowire can travel through a nanowire with higher surface roughness that causes it to slow down and vice versa. A higher pulse width, pulse magnitude and pulse frequency will increase the speed of the domain wall, thus increasing the randomness of the response. The sequence of events in the relay-PUF is illustrated with reference to FIG. 6, in which the domain walls are first nucleated in all the nanowires 600 and then the shift signal is initiated to step the domain walls along the nanowire through the first stage 605. The read head is activated by pulsing the read word line 615 and as soon as the resistance sensed by the read head changes 620 the signal is relayed from the first stage 605 to the second stage 610. Note that, unlike the conventional inverter chain, wherein the transition propagates from one stage to the next, the domain wall vanishes once it reaches the end of the nanowire.

The response of the relay-PUF 400 is determined by an arbiter 440 that decides the earliest arrival of the domain walls in parallel nanowires 420, 425. If the top (bottom) domain wall reaches the read head first, the response of the PUF is '0' ('1'). The nanowire-to-nanowire variation of size and location of surface roughness affects the domain wall velocity, thereby increasing the randomness of the race outcome. Depending upon the path, a fast domain wall in one nanowire may travel slower through another nanowire having a higher surface roughness. In contrast, a slow domain wall can travel through a smoother nanowire in a following stage, thereby increasing its speed. The response is also dependent upon the shift pulse challenges. Higher pulse width, higher magnitude and higher frequency will change the speed of the domain wall and will thereby increase the randomness of the response.

Figure 7A:
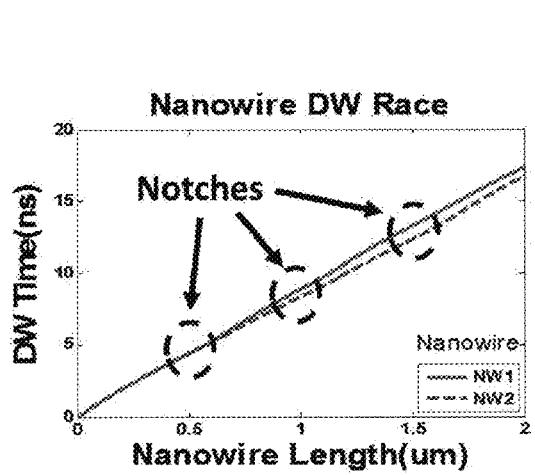
FIG. 7A is a graphical illustration of the nanowire race between two nanowires, in accordance with an embodiment of the present invention.
Figure 7B:
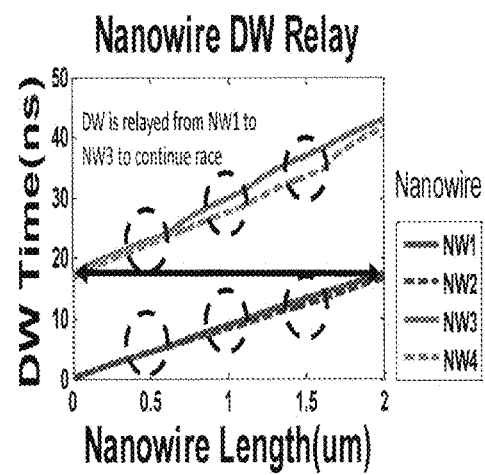
FIG. 7B is a graphical illustration of the domain wall information being relayed from a first nanowire stage (NW1, NW2) to a second nanowire stage (NW3, NW4) where the nanowires are connected as shown in FIG. 4, in accordance with an embodiment of the relay-PUF of the present invention.

With reference to FIG. 7A-7D, the relay race between two domain walls due to process variations is demonstrated using two parallel 2 μm nanowires, each containing two stages. In this exemplary embodiment, the process variations in the nanowires are modeled by assuming three pinning notches at 0.5 μm, 1 μm and 1.5 μm along the length of the nanowire. The values of the pinning potentials are assumed to be 1000, 750 and 500 J/m$^3$ for the top nanowire and 500, 750 and 1000 J/m$^3$ for the bottom nanowire. FIG. 7A illustrates the domain wall positions in the two nanowires w.r.t. time. It can be observed that domain walls race at different speeds due to the difference in pinning potentials. The domain wall in the bottom nanowire (NW2) arrives at the arbiter earlier than the top nanowire (NW1). The relay of the domain walls, from one stage to another, through the challenge multiplexer, is shown with reference to FIG. 7B. As shown, NW1 finishes the race and the sense amplifier triggers the shifting of the domain wall in a third nanowire (NW3). At the end of the race in the second stage, a fourth nanowire (NW4) finishes much earlier than NW3, due to cumulative relay effects. It can be observed that there is a gap of a few picoseconds between the first stage and the second stage, which is the time required for passing the relay (i.e. sense and shift pulse triggering), however, this delay is uniform for all of the nanowire stages and as such doesn't affect the overall result.

Figure 7C:
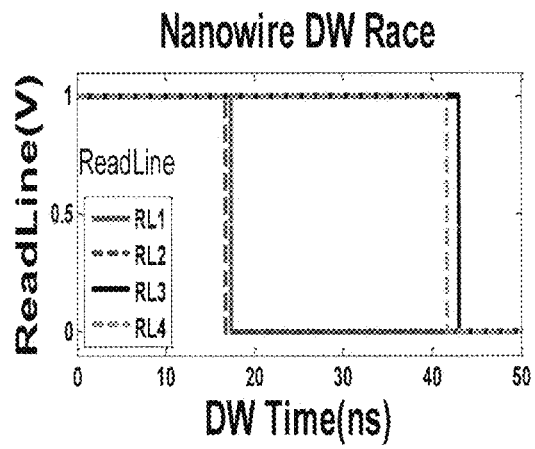
FIG. 7C is a graphical illustration of the sense amplifier output at the end of the domain wall arrival at each nanowire stage, in accordance with an embodiment of the relay-PUF of the present invention.

FIG. 7C illustrates the read head functionality. The sense amplifier of the read head is designed to output a default high value. When the domain wall arrives at the read head, the output is toggled to a low value. It can be observed that RL2 toggles before RL1, indicating the earlier arrival of the domain wall in NW2. The next stage outputs RL3 and RL4 that toggle at the end of the race. Signal RL4 transitions to a low value much earlier than RL3, thereby winning the race. It is noted that the resolution between two races is small. In order to allow time for the read head to detect this difference, the relay-PUF is operated under low voltages, thereby reducing the power consumed and also magnifying the effect of pinning which provides adequate time for the read head to sense the outcome of the race.

Figure 7D:
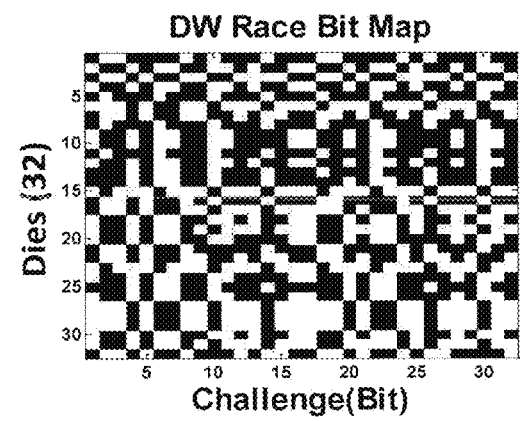
FIG. 7D is an illustration of the response of a 6-stage relay-PUF with 32 challenges and for 32 different integrated circuit dies.

In an additional embodiment, the behavior of the relay-PUF can be altered by changing the challenge. To illustrate this embodiment, the relay-PUF is extended to a design including two parallel paths and six stages. The total number of challenges in this relay-PUF is $2^5$ (i.e., 32 challenges). Therefore, 32 different path combinations are possible in this design, any of which can trigger the race by producing a one bit response. As previously described, process variation within each nanowire can result in different pinning potentials for each notch. In a simulated embodiment, the pinning locations in the nanowire are assumed to be 0.5 µm, 1 µm and 1.5 µm along the length of the 2 µm nanowire, the mean pinning potential is assumed to be 500 J/m³ and a variation of 150 J/m3 (3 sigma) is added to the model to incorporate the effect of process variation-induced pinning potentials. FIG. 7D illustrates the PUF responses, in which the responses for all 32 possible challenges are first simulated and then new sets of process variations are applied to the PUF to simulate inter-die responses. FIG. 7D is a bit map illustrating the PUF responses from the 32 different dies (y-axis) and 32 challenges (x-axis). It can be seen in the bit map that process variations within the nanowires can cause the arbiter outputs to change. The challenge also triggers a change in the PUF response. In this exemplary embodiment, the average die-to-die Hamming Distance (HD) was found to be 47%. Note that the relay-PUF is robust to voltage variations because the voltage will speed up/slow down both paths by the same amount, therefor the net effect (race) will remain unaltered.

In an additional embodiment, a memory-PUF is designed that is similar to an SRAM based PUF, wherein the entire memory bank is potentially used to obtain the authentication key unique to the integrated circuit. In this embodiment, the domain walls in all the nanowires in the memory banks are activated simultaneously and the race concludes when the read signal is asserted. The domain walls winning the race are set to '1' and the domain walls that do not win are set to '0'. In contrast to the relay-PUF, the memory-PUF embodiment does not require any circuit overhead. Due to the non-volatile nature of the bitcell, the memory-PUF also exhibits low power requirements.

Figure 8:
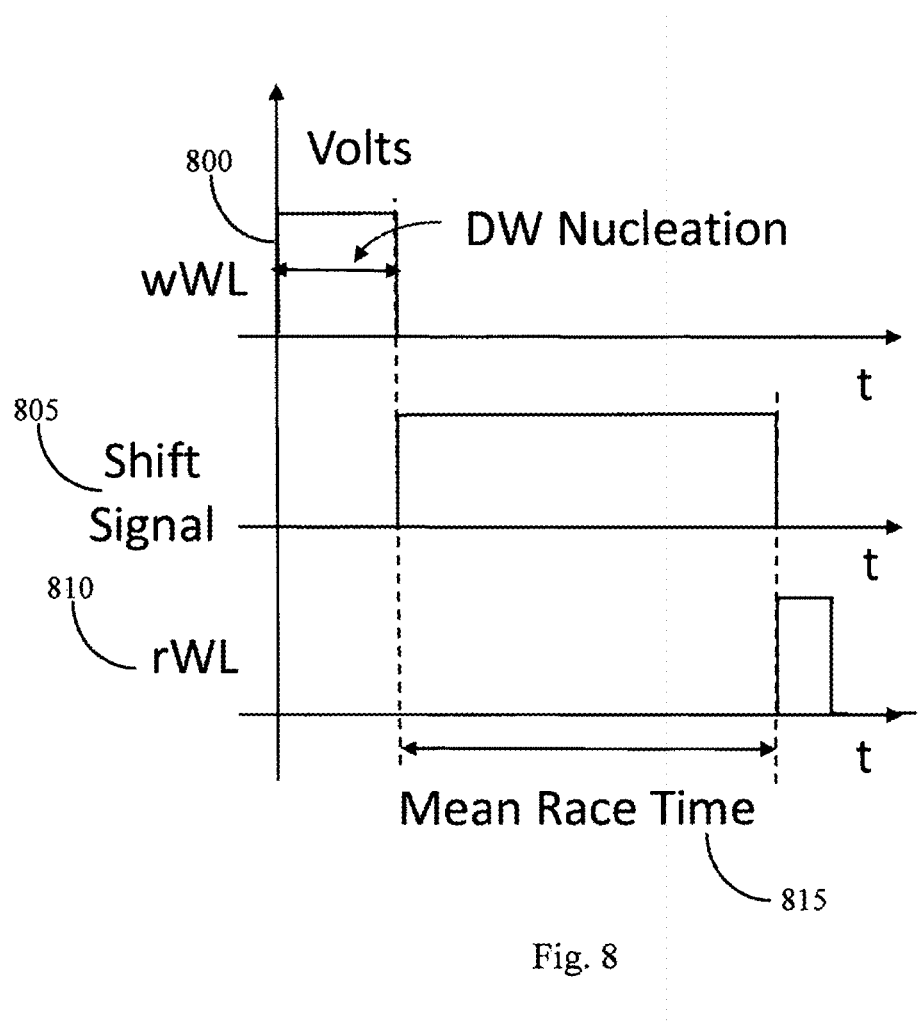
FIG. 8 is a timing diagram representing the wWL, the overall shift signal and the rWL, in accordance with an embodiment of the memory-PUF of the present invention.

In contrast to a convention SRAM-PUF, wherein the memory pattern challenge is solely dependent upon power-up and variations, the domain wall memory-PUF is dependent upon both process variations and shift pulse characteristics, including magnitude, width and frequency. In the memory-PUF, the challenges are the address of the array and the shift pulse. With reference to FIG. 8, similar to the relay-PUF, first a single domain wall is nucleated in all the nanowires present in the memory array 800. After the single domain wall has been nucleated in all the nanowires 800, the domain walls are shifted/raced by a shift pulse challenge 805. The rWL is then fired 810 after a conservative time 815 (mean race time) to screen the pinned domain walls at the end of the race for determining the outcome. The response of the memory-PUF is the output of the array when a certain address is accessed for a particular pulse setting. The value of the bitcell is '1' ('0') if a high (low) resistance is read from the read head, as previously described.

In a simulated embodiment of the memory-PUF, a 100× 100 domain wall memory array is assumed and the intra-die variation is modeled by varying the pinning depth and width as a Gaussian distribution with $(\mu_d, \sigma_d)$ to be (0, 5 nm) and $(\mu_{int}, \sigma_{int})$ to be (0, 2 nm). In this simulated embodiment, three notches are assumed per nanowire at 0.5 µm, 1 µm and 1.5 µm and the pinning potentials are determined from the notch dimensions.

Figure 9A:
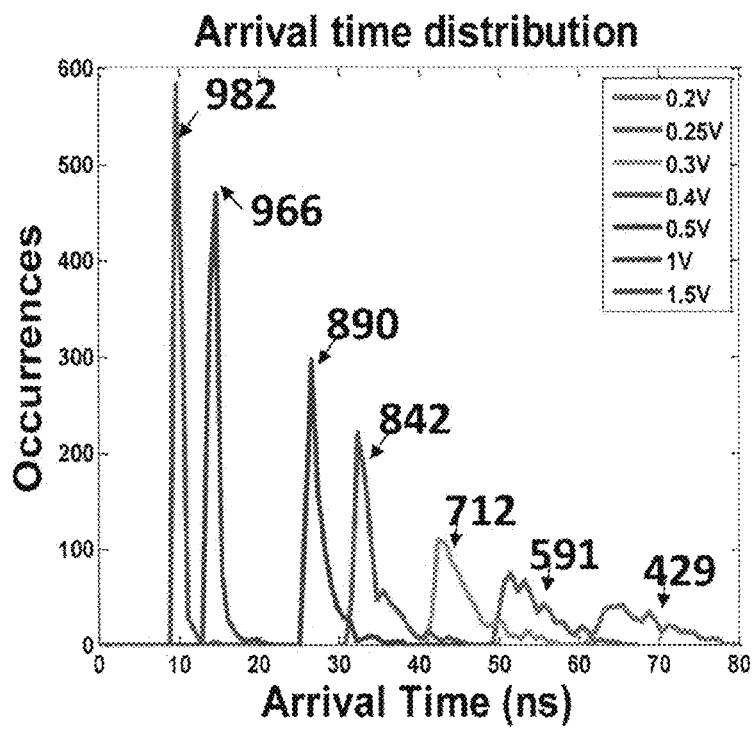
FIG. 9A is a graphical illustration of the arrival time distribution for different shift voltage settings at 25 C and the total number of nanowires under distribution out of 1000 runs of Monte Carlo, in accordance with an embodiment of the present invention.

With reference to FIG. 9A, the simulation at 1V shift pulse shows that only 34 out of the 1000 nanowires result in the domain walls being pinned. Considering the fact that the pinned domain walls will result in a '0' response, this race condition will produce uneven '1's and '0's. In order to balance the '0's and '1's, the shift pulse voltage may be reduced. Shifting at 0.25V instead of 1V produces approximately 59% of '1's (i.e. the domain walls that win the race). By operating the memory-PUF at 0.25V, there is no need to correctly manage the reference read time, as the domain walls that are pinned will always loose the race. However, the problem with this method is that it is susceptibility to variations in temperature. The nanowire resistance is directly proportional to the increase in temperature, which impacts the amount of shift current and affects the domain wall velocity.

Figure 9B:
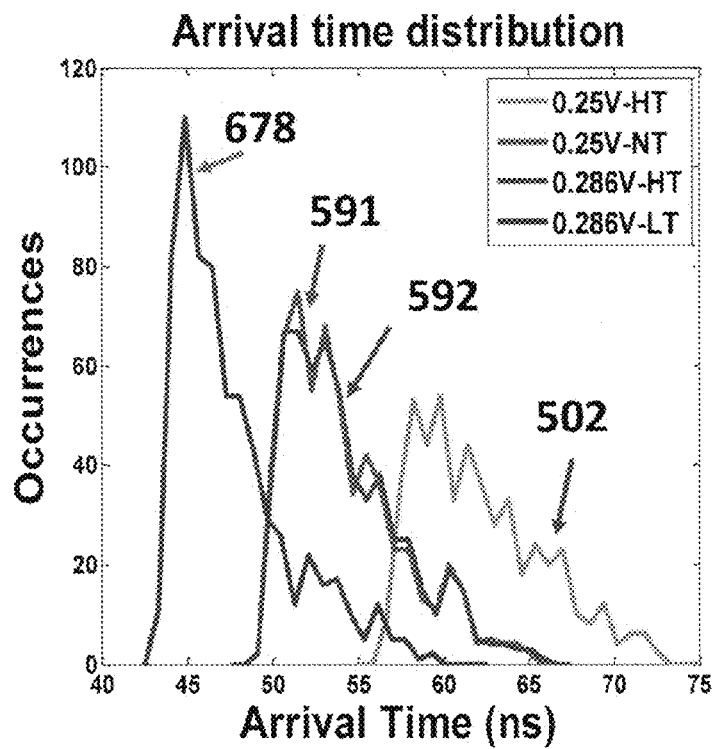
FIG. 9B is a graphical illustration of the arrival time distribution for two voltage settings at 25 C and 125 C and the total number of nanowires under distribution out of 1000 runs of Monte Carlo, in accordance with an embodiment of the present invention.

FIG. 9B illustrates the domain wall arrival time distribution at 0.25V for two temperatures 25 C and 125 C. It can be observed that a high temperature pins more domain walls (409 at 25 C vs. 498 at 125 C), thereby changing the signature of the memory-PUF. In order to maintain the memory-PUF robustness, it is proposed to shift voltage boost at high temperature to negate the effect of extra domain walls pinning. The simulation indicates that boosting the shift voltage by 36.2 mV reduces the number of pinned domain walls back to 408 at 125 C.

Figure 10A:
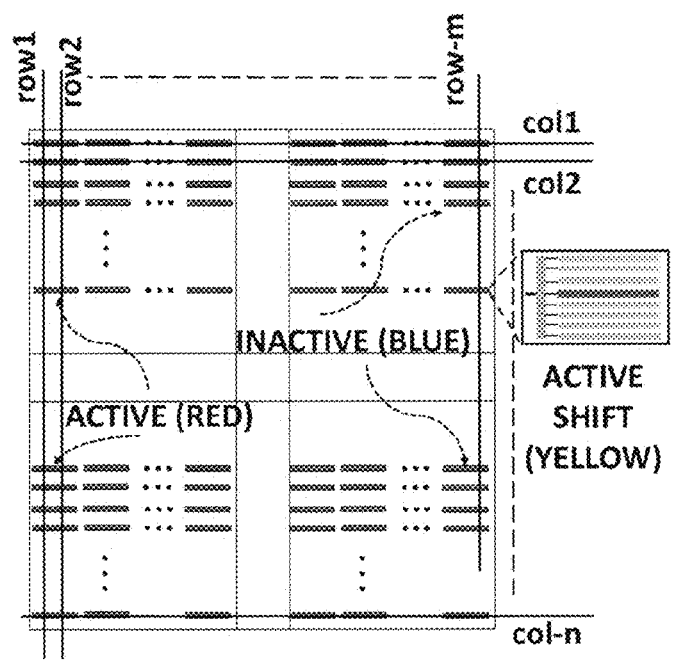
FIG. 10A is an illustration of a bit-interleaved subarray showing active and idle nanowires during shift of the domain walls, in accordance with an embodiment of the present invention.
Figure 10B:
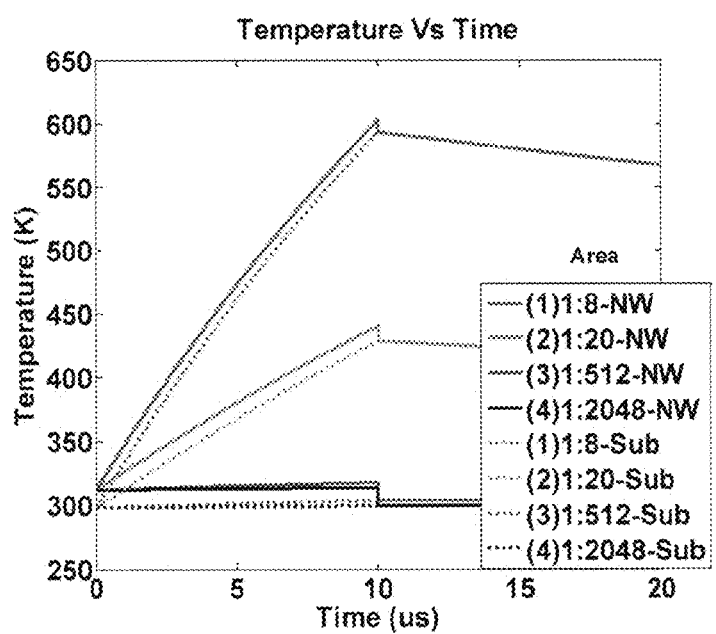
FIG. 10B is a graphical illustration of the temperature profile for 10 µs ON and OFF conditions for different substrate heat dissipation assumptions.

Additionally, it has been found that high current density in the nanowires results in Joule heating and a corresponding rise in temperature and performance degradation. The crucial challenge in domain wall memories is the reliable shift operation, which requires high current density ($\sim 10^{10}$-$10^{12}$ A/m²) to push the domain walls. The domain walls velocity degrades as the temperature increases over time. Therefore, the desired domain wall will fail to reach the read/write head, resulting in functional failure. The shift circuit is shared among the local columns, hence the entire column performs shift in parallel. The wordline is shared amongst all of the rows and activates the nanowires sharing the wordline. This approach enable fast access, but also causes an increase in temperature, as even the unselected nanowires in the columns are made to shift. If a subarray of the domain wall memory array contains n global columns and m rows, then a total of n×m bits perform shift simultaneously, as shown in FIG. 10A, and increase the temperature. This is unique compared to other memory technologies, such as STTRAM, wherein only the selected bits experience Joule heating. FIG. 10B illustrates the temperature profile for 10 µs ON and OFF conditions for different substrate heat dissipation assumptions. The first scenario considers hypothetical case of shifting selected bits only (similar to STTRAM) and assumes that the entire subarray substrate can dissipate the heat. It is inferred from the plot that, Joule heating will not be the problem for this case. The second scenario assumes that half or the substrate (corresponding to selected sector of the subarray) is available for heat dissipation, which shows a minor rise in temperature. The third and fourth scenarios are more realistic because they consider the fact that only neighboring substrate (one global column across both sectors and one global column in the selected sector) will dissipate the heat. This assumption is reasonable because the tangential substrate resistance is orders of magnitudes greater than vertical resistance. Therefore, distant substrates can be neglected. This assumption is further substantiated by the fact that there is an absence of conducting path from one sector to the other, whereas shift lines (LS and RS) can spread some amount of heat across the global column substrate. It is noted that both the third and fourth cases show a 50% to 2× temperature rise with 20 µs of continuous shift operation. The temperature elevation increases the resistance of the nanowire and deteriorates the shift current, which in turn slows down the velocity of the domain walls. As such, Joule heating presents a serious threat to domain wall memory as it can potentially slow down the system performance or cause functional failures due to wrong number of shift operations.

Figure 11A:
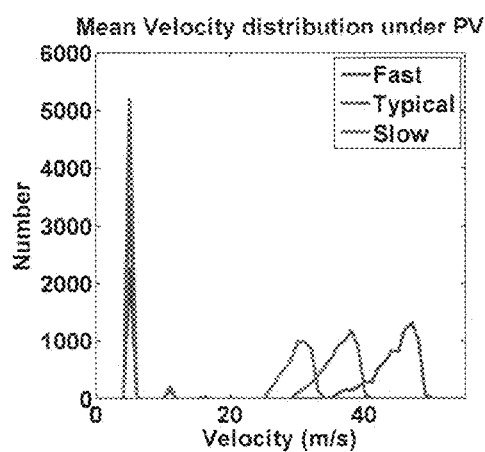
FIG. 11A is a graphical illustration of the velocity distribution in the memory array for fast, typical and slow corner, in accordance with an embodiment of the present invention.
Figure 11B:
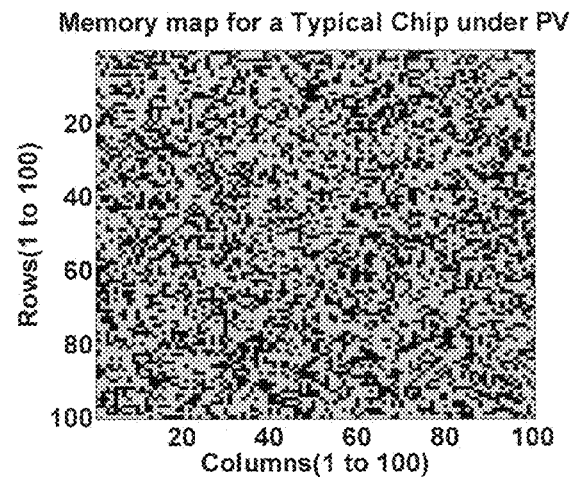
FIG. 11B illustrates a memory map for a fast chip in terms of velocity, in accordance with an embodiment of the present invention.
Figure 11C:
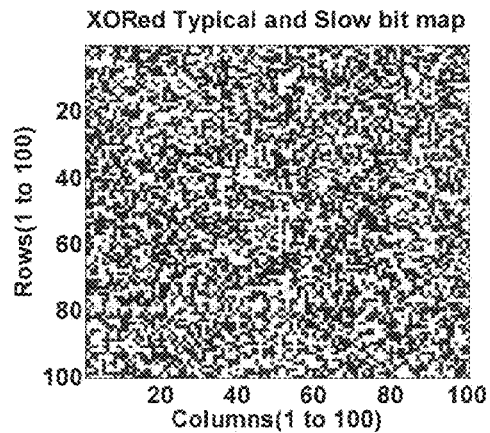
FIG. 11C illustrates a memory map for a typical chip in terms of velocity, in accordance with an embodiment of the present invention.
Figure 11D:
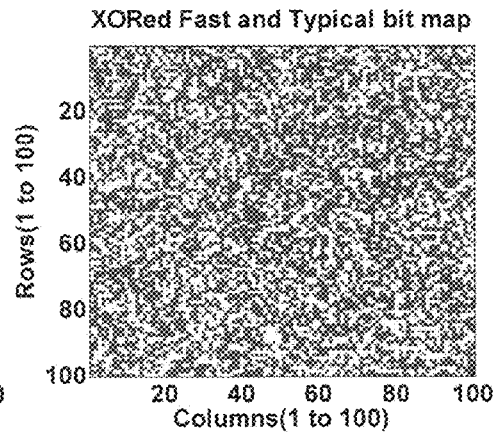
FIG. 11D illustrates a memory map for the differences in the signature between a fast and a typical die in terms of velocity, in accordance with an embodiment of the present invention.

To analyze the die-to-die uniqueness in the response for the memory-PUF, the inter-die process corners (fast and typical) are modeled by skewing the nanowire width and thickness by a factor of 10% (i.e., fast corner is −10% to 10%). FIG. 11A shows the distribution of the velocity for typical inter-die process corners and fast inter-die process corners. Again, the reference is selected to screen the pinned domain walls for all three corners. FIG. 11B shows the '0'/'1' pattern obtained for a fast nanowire. This pattern or signature is the device identity, which varies from die-to-die. FIG. 11C and FIG. 11D illustrate the comparison of the bit pattern for the fast corner and the typical die. FIG. 11C shows the bitmap pattern for a typical nanowire and FIG. 11D shows the XORed pattern for a fast-typical nanowire. It is evident from the comparison that the signatures differ between the various nanowires, achieving an approximate 44% Hamming distance.

Figure 12:
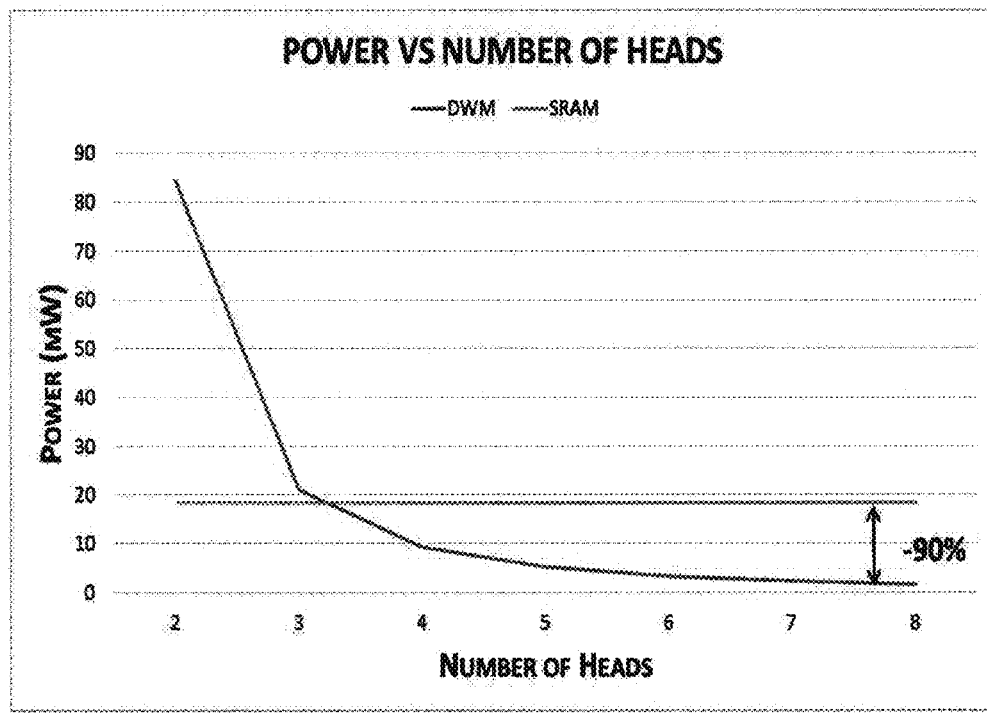
FIG. 12 is a graphical illustration of the power versus number of read heads for the domain wall memory-PUF, in accordance with an embodiment of the present invention.

While the previous embodiment have been described utilizing only one read head and one write head, it is within the scope of the invention to have multiple read heads on a nanowire, which may be individually selected by a wordline (WL). As such, the selection of the read head can be used as another challenge tier. By utilizing multiple read heads in the memory-PUF embodiment, a larger number of responses can be achieved for the same size array or the number of responses can be maintained and the size of the memory can be reduced. The selection of read heads should be performed in an orderly fashion (i.e., head1-head2-head3 . . . ) to avoid the need to reset the domain walls before each analysis. Additionally, as illustrated in FIG. 12, since the shift power is dependent upon the length of the nanowire, the use of multiple read heads in the nanowire will dramatically reduce the power consumed. By increasing the number of read heads, a power reduction of ~10× over SRAM-PUF technology can be achieved. Combining the concept of shift pulse width and pulse magnitude dependence, additional modes of testing the integrated circuit can be achieved.

In various embodiments, the system of the present invention may be implemented in a Field Programmable Gate Array (FPGA) or Application Specific Integrated Circuit (ASIC). As would be appreciated by one skilled in the art, various functions of circuit elements may also be implemented as processing steps in a software program. Such software may be employed in, for example, a digital signal processor, microcontroller or general-purpose computer.

For purposes of this description, it is understood that all circuit elements are powered from a voltage power domain and ground unless illustrated otherwise. Accordingly, all digital signals generally have voltages that range from approximately ground potential to that of the power domain.

It should be emphasized that the above-described embodiments of the present disclosure are merely possible examples of implementations set forth for a clear understanding of the principles of the disclosure. Many variations and modifications can be made to the above-described embodiment(s) without departing substantially from the spirit and principles of the disclosure. All such modifications and variations are intended to be included herein within the scope of this disclosure and protected by the following claims.

The invention claimed is:

1. A method of providing a physically unclonable function (PUF) in a domain wall memory (DWM) array of an integrated circuit:
    applying a domain wall shift pulse challenge to a plurality of nanowires comprising a domain wall memory (DWM) array of an integrated circuit, wherein at least one of the plurality of nanowires comprises at least one process induced variation; and
    measuring the response of the plurality of nanowires of the domain wall memory to the applied domain wall shift pulse challenge to provide a physically unclonable function (PUF) for the integrated circuit.

2. The method of claim 1 further comprising, nucleating a domain wall in the plurality of nanowires of the domain wall memory (DWM) array prior to applying a domain wall shift pulse challenge to the plurality of nanowires.

3. The method of claim 1, wherein the domain wall shift pulse challenge comprises at least one of a pulse magnitude, a pulse width and a pulse frequency.

4. The method of claim 1, wherein the at least one process induced variation establishes a pinning potential within the at least one nanowire.

5. The method of claim 1, wherein applying a domain wall shift pulse challenge to a plurality of nanowires comprising a domain wall memory (DWM) array further comprises, applying the domain wall shift pulse challenge to two or more parallel paths of nanowires in the domain wall memory array.

6. The method of claim 5, wherein measuring the response of the plurality of nanowires of the domain wall memory to the applied domain wall shift pulse challenge to provide a physically unclonable function (PUF) for the integrated circuit further comprises, sensing an earliest arrival of the domain wall for each of the two or more parallel paths of nanowires in the domain wall memory array.

7. The method of claim 5, wherein the two or more parallel paths of nanowires comprises a plurality of nanowire shift stages and applying a domain wall shift pulse challenge further comprises:
    applying the domain wall shift pulse challenge to the nanowires of a first shift stage of the plurality of shift stages;
    sensing when the domain wall has traveled a length of the nanowires of the first shift stage; and
    relaying the shift pulse challenge to the nanowires of a second shift stage when the domain wall has traveled a length of the nanowires of the first shift stage.

8. The method of claim 1, wherein applying a domain wall shift pulse challenge to a plurality of nanowires comprising a domain wall memory (DWM) array further comprises, applying the domain wall shift pulse challenge substantially simultaneous to one or more of the plurality of nanowires in the domain wall memory array.

9. The method of claim 8, wherein measuring the response of the plurality of nanowires of the domain wall memory to the applied domain wall shift pulse challenge to provide a physically unclonable function (PUF) for the integrated circuit further comprises, sensing a bit cell state of one or more of the one or more nanowires based upon a memory address of the domain wall memory array after a predetermined amount of time has elapsed.

10. An integrated circuit comprising a physically unclonable function (PUF), the integrated circuit comprising:
- a domain wall memory (DWM) array comprising a plurality of nanowires, wherein at least one of the plurality of nanowires comprises at least one process induced variation;
- a domain wall shift pulse challenge circuit for applying a domain wall shift pulse challenge to two or more of the plurality of nanowires of the domain wall memory (DWM) array; and
- a measuring circuit for measuring the response of the two or more nanowires of the domain wall memory to the applied domain wall shift pulse challenge to provide a physically unclonable function (PUF) for the integrated circuit.

11. The integrated circuit of claim 10, wherein the domain wall shift pulse challenge comprises at least one of a pulse magnitude, a pulse width and a pulse frequency.

12. The integrated circuit of claim 10, wherein the at least one process induced variation establishes a pinning potential within the at least one nanowire.

13. The integrated circuit of claim 10, wherein the domain wall shift pulse challenge circuit further comprises circuitry for applying the domain wall shift pulse challenge to two or more parallel paths of nanowires in the domain wall memory array.

14. The integrated circuit of claim 13, wherein the measuring circuit further comprises an arbiter for sensing an earliest arrival of the domain wall for each of the two or more parallel paths of nanowires in the domain wall memory array.

15. The integrated circuit of claim 13, wherein the two or more parallel paths of nanowires comprises a plurality of shift stages and the domain wall shift pulse challenge circuit further comprises circuitry for applying the domain wall shift pulse challenge to the nanowires of a first shift stage of the plurality of shift stages, sensing when the domain wall has traveled a length of the nanowires of the first shift stage and relaying the shift pulse challenge to the nanowires of a second shift stage when the domain wall has traveled a length of the nanowires of the first shift stage.

16. The integrated circuit of claim 10, wherein the domain wall shift pulse challenge circuit further comprise circuitry for applying the domain wall shift pulse challenge substantially simultaneously to one or more of the plurality of nanowires in the domain wall memory array.

17. The integrated circuit of claim 16, wherein the measuring circuit further comprises at least one read head for sensing at least one bit cell state of the one or more nanowires based upon a memory address of the domain wall memory array after a predetermined amount of time has elapsed.

18. A device having a physically unclonable function (PUF), the device comprising:
- an integrated circuit;
- a domain wall memory (DWM) array comprising a plurality of nanowires embedded in the integrated circuit, wherein at least one nanowire comprises at least one process induced variation;
- a domain wall shift pulse challenge circuit for applying a domain wall shift pulse challenge to two or more of the plurality of nanowires of the domain wall memory (DWM) array; and
- a measuring circuit for measuring the response of the two or more nanowires of the domain wall memory to the applied domain wall shift pulse challenge to provide a physically unclonable function (PUF) for the integrated circuit.

19. The device of claim 18, wherein the domain wall shift pulse challenge comprises at least one of a pulse magnitude, a pulse width and a pulse frequency.

20. The device circuit of claim 18, wherein the at least one process induced variation establishes a pinning potential within the at least one nanowire.

* * * * *